(12) United States Patent
Eckel et al.

(10) Patent No.: US 10,399,909 B1
(45) Date of Patent: Sep. 3, 2019

(54) ORDERED CELLULAR STRUCTURES AND METHODS OF MANUFACTURING THE SAME

(71) Applicant: HRL LABORATORIES, LLC, Malibu, CA (US)

(72) Inventors: Zak C. Eckel, Thousand Oaks, CA (US); Tobias A. Schaedler, Oak Park, CA (US); Eric C. Clough, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 132 days.

(21) Appl. No.: 15/190,486

(22) Filed: Jun. 23, 2016

Related U.S. Application Data (60) Provisional application No. 62/183,580, filed on Jun. 23, 2015.

(51) Int. Cl.
*C04B 38/00* (2006.01)
*G03F 7/20* (2006.01)

(52) U.S. Cl.
CPC ...... *C04B 38/0022* (2013.01); *C04B 38/0006* (2013.01); *G03F 7/20* (2013.01)

(58) Field of Classification Search
CPC .... C04B 38/0022; C04B 38/0006; G03F 7/20
USPC .......................................... 521/50
See application file for complete search history.

(56) References Cited

U.S. PATENT DOCUMENTS

| | | |
|---|---|---|
| 3,451,841 A | 6/1969 | Kesten et al. |
| 3,873,350 A | 3/1975 | Dwyer et al. |
| 3,880,969 A | 4/1975 | Latos |
| 4,374,202 A | 2/1983 | Zucker et al. |
| 4,885,263 A | 12/1989 | Brookmeyer et al. |
| 4,889,670 A | 12/1989 | Gurak et al. |
| 4,957,577 A | 9/1990 | Huebner |
| 4,981,820 A * | 1/1991 | Renlund ............. C03C 11/00 264/44 |
| 5,643,512 A | 7/1997 | Daws et al. |
| 5,746,879 A | 5/1998 | Huebner et al. |
| 5,792,295 A | 8/1998 | Huebner et al. |
| 6,635,339 B1 | 10/2003 | Adler et al. |
| 6,783,724 B2 | 8/2004 | Noguchi et al. |
| 7,224,258 B2 | 5/2007 | Barge et al. |
| 7,382,959 B1 * | 6/2008 | Jacobsen ............. B82Y 20/00 385/129 |
| 7,653,279 B1 | 1/2010 | Jacobsen |
| 8,017,193 B1 | 9/2011 | Zhou et al. |
| 8,546,064 B2 | 10/2013 | Rock et al. |
| 8,551,579 B2 | 10/2013 | Okazaki |
| 8,906,593 B1 | 12/2014 | Nowak et al. |
| 2006/0069176 A1 * | 3/2006 | Bowman ............. C04B 35/584 522/1 |
| 2011/0117338 A1 | 5/2011 | Poquette et al. |
| 2013/0143060 A1 * | 6/2013 | Jacobsen ............. B29C 71/02 428/594 |

OTHER PUBLICATIONS

Eckel et al., U.S. Appl. No. 62/092,733 entitled "Net Shape Ceramic Microtruss and Ceramic Microtruss With Metal Shell," filed Dec. 16, 2014, 12 pages.
Zhou et al., U.S. Appl. No. 15/060,488 entitled "Cellular Ceramic Materials," filed Mar. 3, 2016, 76 pages.
Zhou et al., U.S. Appl. No. 12/506,859 entitled "Pre-Ceramic Monomer Formulations for Making Preceramic Polymer Waveguides," filed Jul. 21, 2009, 33 pages.

* cited by examiner

*Primary Examiner* — Ronald Grinsted
(74) *Attorney, Agent, or Firm* — Lewis Roca Rothgerber Christie, LLP (57) ABSTRACT

A method of manufacturing an ordered cellular structure including a series of interconnected unit cells. Each unit cell includes at least one straight wall segment. The method includes irradiating a volume of photo-monomer in a reservoir with at least one light beam from at least one light source to form the ordered cellular structure. Irradiating the volume of photo-monomer includes directing the at least one light beam though a series of interconnected apertures defined in a photo-mask covering the reservoir.

19 Claims, 6 Drawing Sheets

ORDERED CELLULAR STRUCTURES AND METHODS OF MANUFACTURING THE SAME

CROSS-REFERENCE TO RELATED APPLICATION

This application claims priority to and the benefit of U.S. Provisional Application No. 62/183,580, entitled Netshape Cellular Material Honeycomb, filed Jun. 23, 2015, the entire contents of which are incorporated herein by reference.

STATEMENT REGARDING FEDERALLY SPONSORED RESEARCH OR DEVELOPMENT

This invention was made with U.S. Government support under United States Contract W91CRB-10-C-0305 awarded by DARPA. The U.S. Government has certain rights to this invention.

FIELD

The present disclosure relates generally to ordered cellular structures and methods of manufacturing ordered cellular structures.

BACKGROUND

Methods exist to manufacture cellular polymer structures. For instance, photolithography may be used in the microfabrication of thin two-dimensional patterns on a thin film or a substrate. Related art photolithography techniques involve using light to transfer a geometric pattern from a photomask to a light-sensitive chemical photoresist on the substrate. However, such related art photolithography techniques are limited to creating relatively thin structures (e.g., nanometer scale patterns for microelectronics) and are unsuitable for developing thicker structures. Related art 3D-printing techniques permit manufacturing thicker structures, but require long print times and have limited sizes in their production beds. Other related art methods for manufacturing polymer structures include the cumbersome and time-consuming tasks of laminating sheets with targeted bonding, cutting, and then expansion of the material.

Methods also exist to manufacture cellular ceramic structures. Related art methods include slurry or CVD coating of polymer foams and foaming of preceramic polymers. However, these related art methods have limited control over cell size and spacing uniformity. Additionally, these related art methods may require many processing tasks to create a substrate and convert it to ceramic. Additionally, to maintain the ceramic shape, high temperature molds must be used during the firing process.

Related art methods to create ceramic foams from preceramic polymers result in a ceramic with bulk porosity and microporosity. Additionally, related art ceramic foams have a random distribution of sizes within the architecture.

SUMMARY

Aspects of embodiments of the present disclosure are directed to various methods of manufacturing an ordered cellular structure including a series of interconnected unit cells, wherein each unit cell of the series of interconnected unit cells includes at least one straight wall segment. In one embodiment, the method includes irradiating a volume of photo-monomer in a reservoir with at least one light beam from at least one light source to form the ordered cellular structure. Irradiating the volume of photo-monomer including directing the at least one light beam though a series of interconnected apertures defined in a photo-mask covering the reservoir. At least one aperture of the series of interconnected apertures in the photo-mask may be prismatic (e.g., a hexagonal or pentagonal prism). At least one aperture of the series of apertures in the photo-mask may be non-prismatic (e.g., cylindrical). The series of apertures in the photo-mask may be arranged in a tessellation. Directing the at least one light beam through the series of interconnected apertures defined in the photo-mask may include directing the at least one light beam at an angle substantially orthogonal to the photo-mask or at an oblique angle relative to the photo-mask. The shape and/or size of the series of interconnected apertures may vary across the photo-mask. The method may further include metallizing at least a portion of the ordered cellular structure. The method may also include shaping the ordered cellular structure into a non-planar shape by bending, molding, stretching, impressing, embossing, machining, or combinations thereof. The reservoir may have a non-planar contoured shape. The volume of photo-monomer in the reservoir may have a depth greater than approximately 1.5 mm.

Aspects of embodiments of the present disclosure are also directed to various methods of manufacturing a ceramic cellular structure includes a series of interconnected unit cells, wherein each unit cell of the series of interconnected unit cells includes at least one straight wall segment. The method includes irradiating a volume of photo-monomer in a reservoir with at least one light beam from at least one light source. Irradiating the volume of photo-monomer forms a partially cured polymer cellular structure. The method also includes post-curing the partially cured polymer cellular structure to form a fully cured polymer cellular structure and pyrolyzing the fully cured polymer cellular structure to form the ceramic cellular structure having the series of interconnected unit cells. Pyrolyzing the polymer cellular structure may include heating the fully cured polymer cellular structure in a furnace to a temperature of at least 600° C. in an inert atmosphere. The method may also include shaping the partially cured polymer cellular structure into a non-planar shape. The method may include metallizing at least a portion of a surface of the ceramic cellular structure. Heating the polymer cellular structure may include raising a temperature in the furnace at a rate less than or equal to approximately (about) 40° C. per minute. Inerting atmosphere exhaust gases may develop in the fully cured polymer cellular structure during the pyrolyzing of the fully cured polymer cellular structure, and the method may include purging the exhaust gases from the furnace. The at least one straight wall segment of each unit cell may have a wall thickness less than or equal to approximately (about) 4 mm.

Aspects of embodiments of the present disclosure are also directed to various embodiments of an ordered cellular structure including a series of interconnected unit cells. Each unit cell of the series of interconnected unit cells includes at least one straight wall segment and each of the unit cells of the series of interconnected unit cells includes a pre-ceramic polymer. The series of interconnected unit cells may be arranged in a tessellation. At least one unit cell of the series of unit cells may have a prismatic shape (e.g., a hexagonal or pentagonal prism) or a non-prismatic shape (e.g., a cylinder). The pre-ceramic polymer may include one or more poly-siloxanes, silazanes, silanes, carbosilanes, or combinations thereof.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of ordered cellular structures and methods of manufacturing the same. In one or more embodiments, the cellular structure is a closed cellular structure. In one or more embodiments, the cellular structure includes a series of interconnected unit cells. Each of the unit cells includes at least one straight wall segment. The unit cells may have any suitable shape, such as a prismatic shape (e.g., hexagonal or pentagonal prisms), a nonprismatic shape (e.g., cylinders), or combinations thereof. As used herein, the term "prismatic" refers to shapes having two opposite ends and parallelogram-shaped sides. Additionally, the term "prismatic" as used herein encompasses shapes with open ends or closed ends. In one or more embodiments, the cellular structure may have a thickness of at least 1.5 mm. In one or more embodiments, the cellular structure may be spatially tailored to include spatial variations in wall thickness, unit cell shape, and/or unit cell size (e.g., unit cell thickness variations). The cellular structures of the present disclosure may be used in a variety of applications, including as a primary or secondary load structure (e.g., interior paneling) and/or as an impact energy absorption structure. For instance, the ordered cellular structures of the present disclosure may be used in military and commercial aerospace applications (e.g., a core for a hot structure sandwich panel, exhaust nozzle structures, afterburner flaps, hot section liners and shrouds, interior paneling, or high speed vehicle aeroshells) or automotive applications (e.g., internal panels, engine components, catalyst support in a catalytic converter).

Figure 1A:
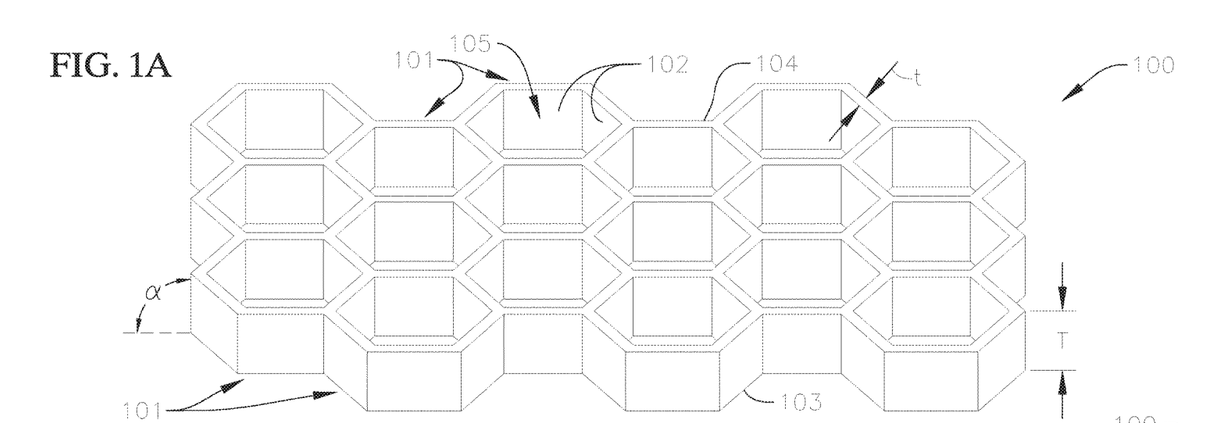
FIG. 1A is a perspective view of an ordered cellular structure according to one embodiment of the present disclosure.

With reference now to the FIG. 1A, an ordered cellular structure 100 according to one embodiment of the present disclosure includes a series of interconnected unit cells 101. In the illustrated embodiment, each unit cell 101 includes six straight wall segments 102 arranged in a hexagonal shape such that each unit cell 101 is a hexagonal prism. Additionally, in the illustrated embodiment, the hexagonal unit cells 101 are arranged in a tessellation. Accordingly, in the illustrated embodiment, the ordered cellular structure 100 is a honeycomb structure. In one or more embodiments, the unit cells 101 may have any other suitable shape, such as, for instance, any other prismatic shape (e.g., pentagonal prisms, square prisms, or triangular prisms), a nonprismatic shape (e.g., cylinders), or a combination thereof. Accordingly, although in the illustrated embodiment each unit cell 101 includes six straight wall segments 102, in one or more embodiments, the unit cells 101 may have any other suitable number of straight wall segments 102, such as, for instance, from one to eight straight wall segments 102, depending on the shape of the unit cells 101. Additionally, although in the illustrated embodiment each unit cell 101 has the same shape, in one or more alternate embodiments, two or more of the unit cells 101 may have different shapes.

Additionally, although in the illustrated embodiment the ordered cellular structure 100 is uniform (e.g., each unit cell 101 has the same size and shape), in one or more alternate embodiments the ordered cellular structure 100 may be spatially tailored or graded depending on the intended application of the ordered cellular structure 100. For instance, the shape and/or size of the unit cells 101 may vary across the ordered cellular structure 100 depending on the spatial distribution of the mechanical loads the ordered cellular structure 100 is designed to bear. In one or more embodiments, the unit cells 101 may not be arranged in a tessellation (e.g., the unit cells 101 may be arranged in any other suitable pattern or an irregular arrangement). Additionally, in one or more embodiments, a wall thickness t of the straight wall segments 102 may vary across the ordered cellular structure 100. In one or more embodiments, the wall thickness t of the straight wall segments 102 may be approximately (about) 4 mm or less. Moreover, although in the illustrated embodiment the ordered cellular structure 100 has a constant or uniform thickness T measured from a lower end 103 of the ordered cellular structure 100 to an upper end 104 of the ordered cellular structure 100, in one or more embodiments, the thickness T may vary across the ordered cellular structure 100.

In the illustrated embodiment, the straight wall segments 102 of each unit cell 101 are arranged in a closed loop such that each unit cell 101 is a closed cell (e.g., the straight wall segments 102 of each unit cell 101 are arranged and interconnected to form a continuous structure). For instance, in the illustrated embodiment, the straight wall segments 102 of each unit cell 101 define a cavity 105 and each cavity 105 is isolated or separated by the straight wall segments 102 from the cavities 105 defined by the other unit cells 101. In one or more alternate embodiments, the ordered cellular structure 100 may be an open cellular structure. For instance, in one or more embodiments, the cavities 105 defined by the unit cells 101 may be in fluid communication with each other by apertures (e.g., holes or slots) in one or more of the straight wall segments 102 of the unit cells 101.

With continued reference to the embodiment illustrated in FIG. 1A, each straight wall segment 102 extends straight or substantially straight from the lower end 103 of the ordered cellular structure 100 to the upper end 104 of the ordered cellular structure 100. Additionally, although in the illustrated embodiment, the straight wall segments 102 of the unit cells 101 extend perpendicular or substantially perpendicular to upper and lower ends 104, 103 of the ordered cellular structure 100, in one or more embodiments, the straight wall segments 102 of the units cells 101 may extend obliquely (e.g., canted or sloped) to the upper and/or lower ends 104, 103 of the ordered cellular structure 100 (e.g., the straight wall segments 102 of the unit cells 101 may be canted relative to the upper and lower ends 104, 103 of the ordered cellular structure 100). The straight wall segments 102 may extend at any suitable angle α relative to the upper and lower ends 104, 103 of the ordered cellular structure 100, such as, for instance, from approximately (about) 45 degrees to approximately (about) 90 degrees.

In the embodiment illustrated in FIG. 1A, each of the straight wall segments 102 of the unit cells 101 extend in the same or substantially same direction. In one or more embodiments, two or more of the straight wall segments 102 may extend in different directions. For instance, in one or more embodiments, one or more of the straight wall segments 102 are perpendicular (normal) or substantially perpendicular to the upper and lower ends 104, 103 of the ordered cellular structure 100 and one or more of the straight wall segments 102 are canted relative to the upper and lower ends 104, 103 of the ordered cellular structure 100.

Figure 1B:
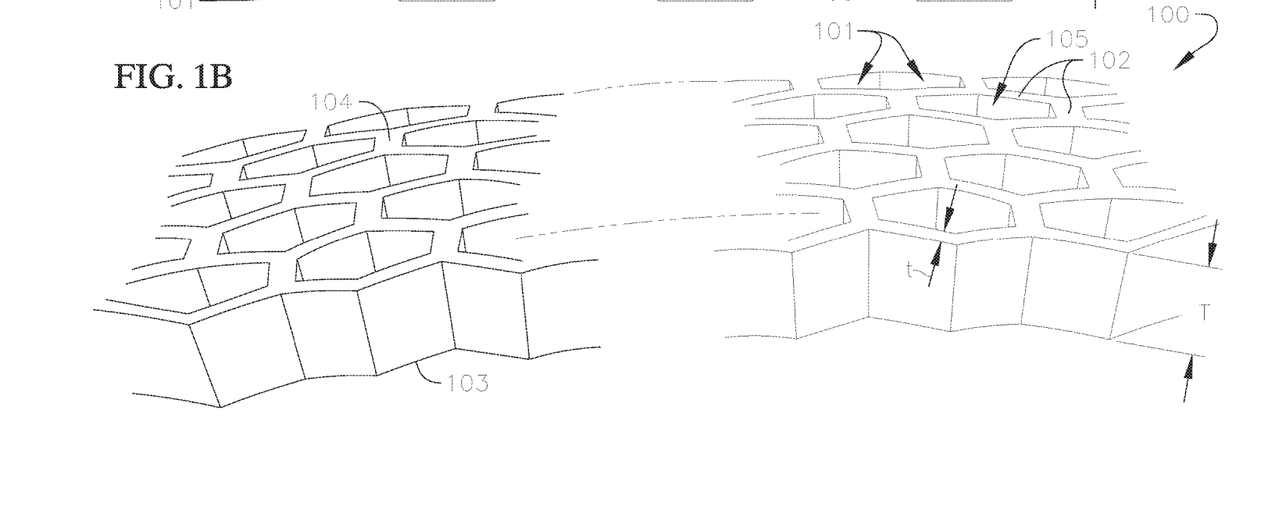
FIG. 1B is a perspective view of the ordered cellular structure illustrated in FIG. 1A having a non-planar curvature.

Additionally, although in the embodiment illustrated in FIG. 1A the ordered cellular structure 100 is planar or substantially planar, in one or more alternate embodiments, the ordered cellular structure 100 (or at least a portion thereof) may have a non-planar curvature. For instance, FIG. 1B illustrates the ordered cellular structure 100 having a non-planar curvature. The ordered cellular structure 100 (or at least a portion thereof) may have any suitable non-planar shape and the ordered cellular structure 100 may have any suitable degree, extent, or magnitude of non-planarity depending on the intended application of the ordered cellular structure 100. In one or more embodiments, at least a portion of the ordered cellular structure 100 may be conical, tubular, or saddle shaped. In one or more embodiments, at least a portion of the ordered cellular structure 100 has a radius of curvature from approximately (about) 3 times the thickness T of the ordered cellular structure 100 to approximately (about) 100 times the thickness T of the ordered cellular structure 100.

The ordered cellular structure 100 may be made out of any material suitable for the intended application of the ordered cellular structure 100, such as, for instance, polymer or ceramic. In one or more embodiments, the ordered cellular structure 100, or at least a portion thereof, may include a metal coating or a metal shell on an outer surface of the ordered cellular structure 100. The metal shell may made of any suitable metal configured to increase the toughness, strength, chemical resistance (e.g., environmental resistance), and/or thermal resistance of the ordered cellular structure 100. In one or more embodiments, the metal shell may have a thickness of at least 100 nanometers (nm). In one or more embodiments, the ordered cellular structure 100 may be a hollow metal shell.

Additionally, in one or more embodiments, the ordered cellular structure 100 illustrated in FIG. 1A or FIG. 1B may incorporated into a sandwich structure by coupling an upper facesheet to the upper end 104 of the ordered cellular structure 100 and coupling a lower facesheet to the lower end 103 of the ordered cellular structure 100.

Figure 2A:
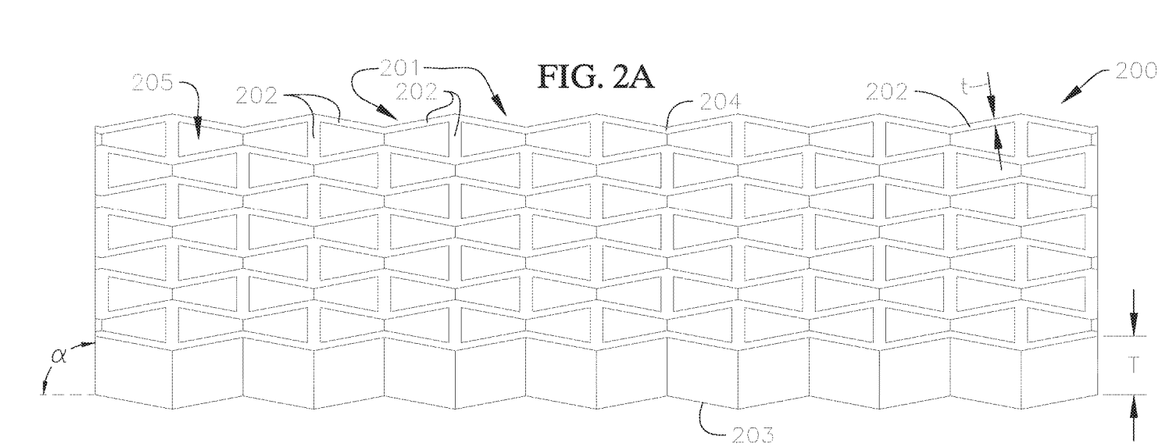
FIG. 2A is a perspective view of a cellular structure according to another embodiment of the present disclosure.

With reference now to FIG. 2A, an ordered cellular structure 200 according to another embodiment of the present disclosure includes a series of interconnected unit cells 201. In the illustrated embodiment, each unit cell 201 includes six straight wall segments 202 arranged in a re-entrant honeycomb shape (e.g., a bowtie shape) such that each unit cell 201 is a re-entrant honeycomb-shaped prism (e.g., a bowtie-shaped prism). Additionally, in the illustrated embodiment, the re-entrant honeycomb-shaped unit cells 201 (e.g., the bowtie-shaped unit cells) are arranged in a tessellation, although in one or more embodiments, the re-entrant honeycomb-shaped unit cells 201 may not be arranged in a tessellation (e.g., the unit cells 201 may be arranged in any other suitable pattern or an irregular arrangement).

Although in the illustrated embodiment the ordered cellular structure 200 is uniform (e.g., each unit cell 201 has the same size and shape), in one or more alternate embodiments the ordered cellular structure 200 may be spatially tailored or graded depending on the intended application of the ordered cellular structure 200. For instance, the shape and/or size of the unit cells 201 may vary across the ordered cellular structure 200 depending on the spatial distribution of the mechanical loads the ordered cellular structure 200 is designed to bear. Additionally, in one or more embodiments, a wall thickness t of the straight wall segments 202 may vary across the ordered cellular structure 200. In one or more embodiments, the wall thickness t of the straight wall segments 202 may be approximately (about) 4 mm or less. Moreover, although in the illustrated embodiment the ordered cellular structure 200 has a constant or uniform thickness T measured from a lower end 203 of the ordered cellular structure 200 to an upper end 204 of the ordered cellular structure 200, in one or more embodiments, the thickness T may vary across the ordered cellular structure 200.

In the illustrated embodiment, the straight wall segments 202 of each unit cell 201 are arranged in a closed loop such that each unit cell 201 is a closed cell (e.g., the straight wall segments 202 of each unit cell 201 are arranged and interconnected to form a continuous structure). For instance, in the illustrated embodiment, the straight wall segments 202 of each unit cell 201 define a cavity 205 and each cavity 205 is isolated or separated by the straight wall segments 202 from the cavities 205 defined by the other unit cells 201. In one or more alternate embodiments, the ordered cellular structure 200 may be an open cellular structure. For instance, in one or more embodiments, the cavities 205 defined by the unit cells 201 may be in fluid communication with each other by apertures (e.g., holes or slots) in one or more of the straight wall segments 202 of the unit cells 201.

With continued reference to the embodiment illustrated in FIG. 2A, each straight wall segment 202 extends straight or substantially straight from the lower end 203 of the ordered cellular structure 200 to the upper end 204 of the ordered cellular structure 200. Additionally, although in the illustrated embodiment, the straight wall segments 202 of the unit cells 201 extend perpendicular or substantially perpendicular to upper and lower ends 204, 203 of the ordered cellular structure 200, in one or more embodiments, the straight wall segments 202 of the units cells 201 may extend obliquely (e.g., canted or sloped) to the upper and/or lower ends 204, 203 of the ordered cellular structure 200 (e.g., the straight wall segments 202 of the unit cells 201 may be canted relative to the upper and lower ends 204, 203 of the ordered cellular structure 200). The straight wall segments 202 may extend at any suitable angle α relative to the upper and lower ends 204, 203 of the ordered cellular structure 200, such as, for instance, from approximately 45 degrees to approximately 90 degrees.

In the embodiment illustrated in FIG. 2A, each of the straight wall segments 202 of the unit cells 201 extend in the same or substantially same direction. In one or more embodiments, two or more of the straight wall segments 202 may extend in different directions. For instance, in one or more embodiments, one or more of the straight wall segments 202 are perpendicular or substantially perpendicular to the upper and lower ends 204, 203 of the ordered cellular structure 200 and one or more of the straight wall segments 202 are canted relative to the upper and lower ends 204, 203 of the ordered cellular structure 200.

Figure 2B:
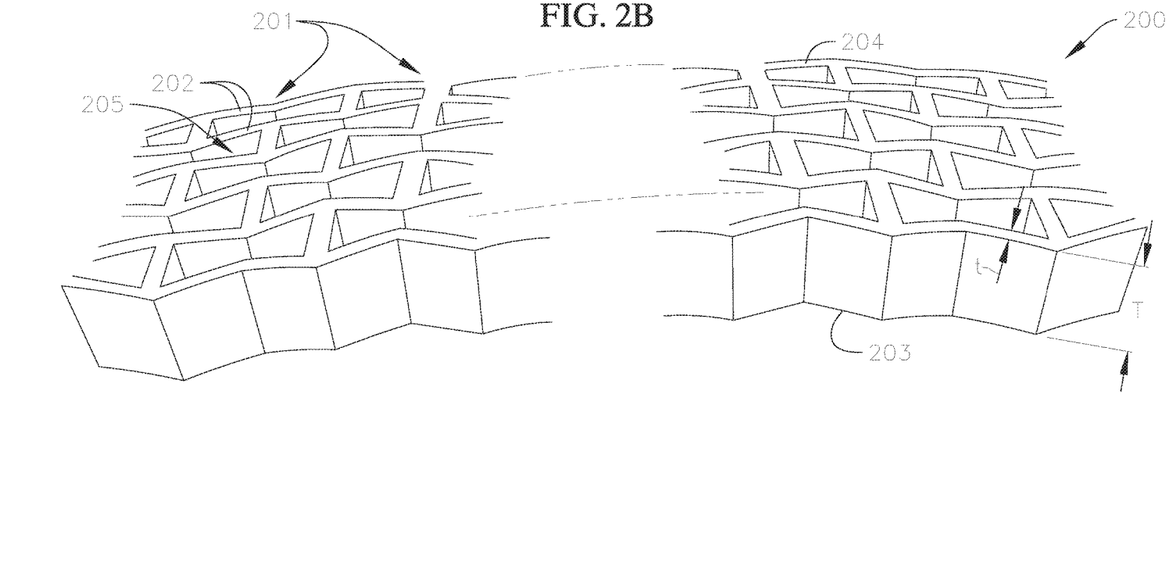
FIG. 2B is a perspective view of the ordered cellular structure illustrated in FIG. 2A having a non-planar curvature.

Although in the embodiment illustrated in FIG. 2A the ordered cellular structure 200 is planar or substantially planar, in one or more embodiments the ordered cellular structure 200 (or at least a portion thereof) may have a non-planar curvature. For instance, FIG. 2B illustrates the ordered cellular structure 200 having a non-planar curvature. The ordered cellular structure 200 (or at least a portion thereof) may have any suitable non-planar shape and the ordered cellular structure 200 may have any suitable degree, extent, or magnitude of non-planarity depending on the intended application of the ordered cellular structure 200. In one or more embodiments, at least a portion of the ordered cellular structure 200 may be conical, tubular, or saddle shaped. In one or more embodiments, at least a portion of the ordered cellular structure 200 has a radius of curvature from approximately (about) 3 times the thickness T of the ordered cellular structure 200 to approximately (about) 100 times the thickness T of the ordered cellular structure 200.

The ordered cellular structure 200 may be made out of any material suitable for the intended application of the ordered cellular structure 200, such as, for instance, polymer or ceramic. In one or more embodiments, the ordered cellular structure 200, or at least a portion thereof, may include a metal coating or a metal shell on an outer surface of the ordered cellular structure 200. The metal shell may made of any suitable metal configured to increase the toughness, strength, chemical resistance (e.g., environmental resistance), and/or thermal resistance of the ordered cellular structure 200. In one or more embodiments, the metal shell may have a thickness of at least 100 nanometers (nm). In one or more embodiments, the ordered cellular structure 200 may be a hollow metal shell.

Additionally, in one or more embodiments, the ordered cellular structure 200 illustrated in FIG. 2A or FIG. 2B may incorporated into a sandwich structure by coupling an upper facesheet to the upper end 204 of the ordered cellular structure 200 and coupling a lower facesheet to the lower end 203 of the ordered cellular structure 200.

Figure 3A:
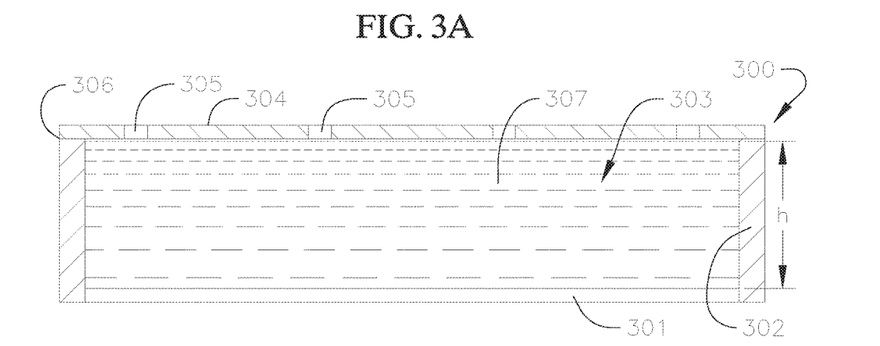
FIGS. 3A-3C are schematic illustrations of tasks of manufacturing a cellular structure according to one embodiment of the present disclosure.
Figure 3B:
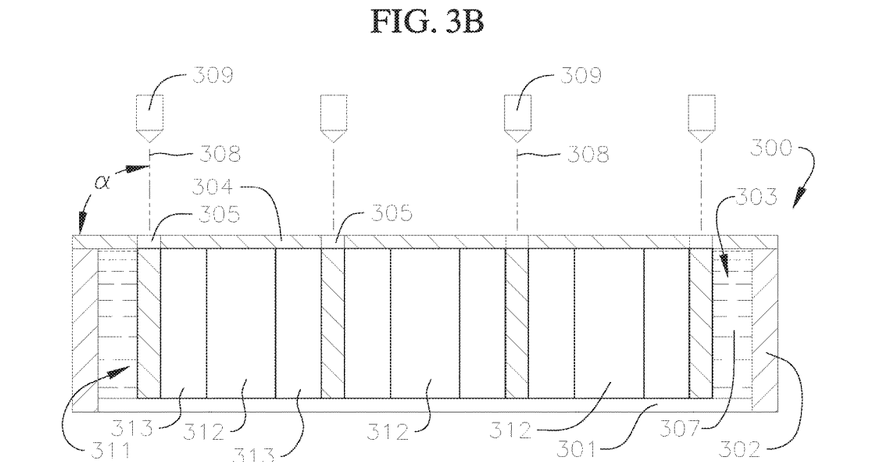
Figure 3C:
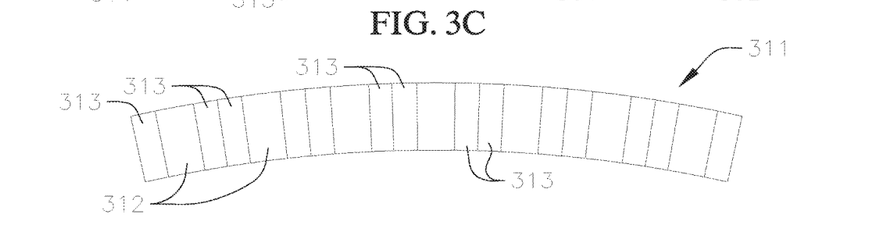

With reference now to FIGS. 3A-3C, a method of forming an ordered cellular structure (e.g., 100 or 200) having a series of interconnected unit cells (e.g., 101 or 201) according to one embodiment of the present disclosure includes a task of obtaining or providing a mold 300 having a base 301 and a vertical wall or rim 302 extending upward from a periphery of the base 301. Together, the base 301 and the rim 302 the mold 300 define a chamber or reservoir 303. With continued reference to the embodiment illustrated in FIG. 3A, the method also includes a task of covering an upper end 306 of the reservoir 303 with a photomask 304 defining a series of apertures 305 (e.g., openings or other light transparent features). In one or more alternate embodiments, the method may include a task of covering the base 301 of the mold 300 with the photomask 304. The mask 304 may define any desired number of apertures 305, and the apertures 305 may have any desired size, shape, and spacing, depending upon the desired architecture of the ordered cellular structure, as described below in more detail. Additionally, the photomask 304 may be made of any suitable material, such as, for instance, biaxially-oriented polyethylene terephthalate.

With continued reference to the embodiment illustrated in FIG. 3A, the method includes a task of filling the reservoir 303 with a volume of liquid photo-monomer 307. The volume of liquid photo-monomer 307 may be filled to any suitable height h within the reservoir 303 depending on the desired thickness T of the cellular structure (see FIGS. 1A and 2A). In one or more embodiments, the liquid photo-monomer 307 may be filled to a height h of greater than or equal to approximately (about) 1.5 mm. The photo-monomer 307 is configured to polymerize when exposed to light within a particular range of wavelengths, such as, for instance, ultraviolet light (i.e., wavelengths between 250 nm and 400 nm). The liquid photo-monomer 307 may be any suitable type of monomer configured to polymerize when exposed to light, such as, for instance, thiol-ene, acrylates, methacrylates, or cationic polymers (e.g., photo-cured epoxies). Suitable liquid photo-monomers are described in U.S. Pat. Nos. 8,017,193 and 8,906,593 and U.S. Patent Application Nos. 62/128,410 and Ser. No. 12/506,859, the entire contents of each of which are incorporated herein by reference.

Referring now to the embodiment illustrated in FIG. 3B, the method also includes a task of irradiating the volume of liquid photo-monomer 307 in the reservoir 303 with one or more light beams 308 (e.g., one or more collimated or substantially collimated ultraviolet light ("UV") beams) from one or more light sources 309. The task of irradiating the photo-monomer 307 includes directing the one or more light beams 308 from the one or more light sources 309 down through the apertures 305 in the photomask 304. In the illustrated embodiment, the apertures 305 in the photomask 304 are translucent to those wavelengths of light that are configured to polymerize the liquid photo-monomer 307 in the reservoir 303 such that the one or more light beams 308 pass through the photomask 304 and irradiate the volume of photo-monomer 307 in the reservoir 303. In one embodiment, the task of irradiating the photo-monomer 307 may also include directing the one or more light beams 308 from the one or more light sources 309 off of one or more mirrors and down through the apertures 305 in the mask 304. Regions of the liquid photo-monomer 307 that are exposed to the one or more light beams 308 cure (i.e., polymerize). The polymerized regions propagate down through the volume of photo-monomer 307 and form a plurality of polymer optical waveguides 310. In one embodiment, the polymer optical waveguides 310 are polymerized together into a unitary ordered cellular structure 311 including a series of interconnected unit cells 312. Each unit cell 312 includes one or more straight wall segments 313. Suitable methods for forming polymer optical waveguides 310 are described in U.S. Pat. Nos. 7,653,279 and 7,382,959, the entire content of both of which are incorporated herein by reference. In one or more alternate embodiments, the method may include covering the base 301 of the reservoir 303 with the photomask 304 and directing the one or more light beams 308 up through apertures 305 in the photomask 304, through the base 301, and into the volume of liquid photo-monomer 307. In an embodiment in which the method includes covering the base 301 of the reservoir 303 with the photomask 304 and directing the one or more light beams 308 up through apertures 305 in the photomask 304 and up through the base 301, the base 301 of the mold 300 is translucent to those wavelengths of light that are configured to polymerize the liquid photo-monomer 307 in the reservoir 303.

Following the task of irradiating the photo-monomer 307 with the one or more light beams 308, the ordered cellular structure 311 is in a partially cured state (i.e., a green state). That is, following the task of irradiating the photo-monomer 307 with the one or more light beams 308, the functional groups of the ordered cellular structure 311 are partially cross-linked.

The orientation of the straight wall segments 313 of the ordered cellular structure 311 depends on an incident angle α of the one or more light beams 308 relative to the photomask 304 (i.e., the orientation of the straight wall segments 313 is a function of the incident angle α at which the one or more light beams 308 strike the volume of photo-monomer 307 in the reservoir 303). In the illustrated embodiment, the task of irradiating the volume of liquid photo-monomer 307 in the reservoir 303 includes directing the one or more light beams 308 into the liquid photo-monomer 307 at an incident angle α of approximately (about) 90 degrees relative to the photomask 304 (i.e., the one or more light beams 308 are directed into the photo-monomer 307 in a direction perpendicular or substantially perpendicular to the photomask 304). The incident angle α of the one or more light sources 309 may be achieved by orienting the one or more light sources 309 and/or the one or more mirrors. In the illustrated embodiment, the task of irradiating the photo-monomer 307 in the reservoir 303 with the one or more lights beams 308 includes directing the one or more light beams 308 into the photo-monomer 307 at an incident angle α of approximately (about) 90 degrees relative to the photomask 304 to form an ordered cellular structure 311 in which the straight wall segments 313 of the unit cells 312 are perpendicular or substantially perpendicular to upper and lower ends of the ordered cellular structure 311. In one or more alternate embodiments, the task may include directing the one or more light beams 308 into the photo-monomer 307 at any other suitable incident angle α depending on the desired orientation of the straight wall segments 313 of the unit cells 312. For instance, in one or more embodiments, the task may include directing the one or more light beams 308 into the photo-monomer 307 at an incident angle α that is canted relative to the photomask 304 (e.g., an angle α from approximately (about) 45 degrees to approximately (about) 90 degrees) to form an ordered cellular structure 311 in which the straight wall segments 313 of the unit cells 312 are canted relative to the upper and lower ends of the ordered cellular structure 311. The one or more light sources 309 may be any suitable type or kind of lamp capable of emitting one or more light beams 308 within a range of wavelengths configured to polymerize the liquid photo-monomer 307, such as, for instance, mercury arc lamps (e.g., 2000W lamp) or light-emitting diodes (LEDs).

Additionally, in one or more embodiments, the task of irradiating the volume of liquid photo-monomer 307 in the reservoir 303 may include varying the incident angles α of the light beams 308 at different locations along the photomask 304 (e.g., by varying the orientation of the one or more light sources 309 and/or the orientation of the mirrors) to form an ordered cellular structure 311 in which the orientation of the straight wall segments 313 varies across the ordered cellular structure 311.

Figure 4:
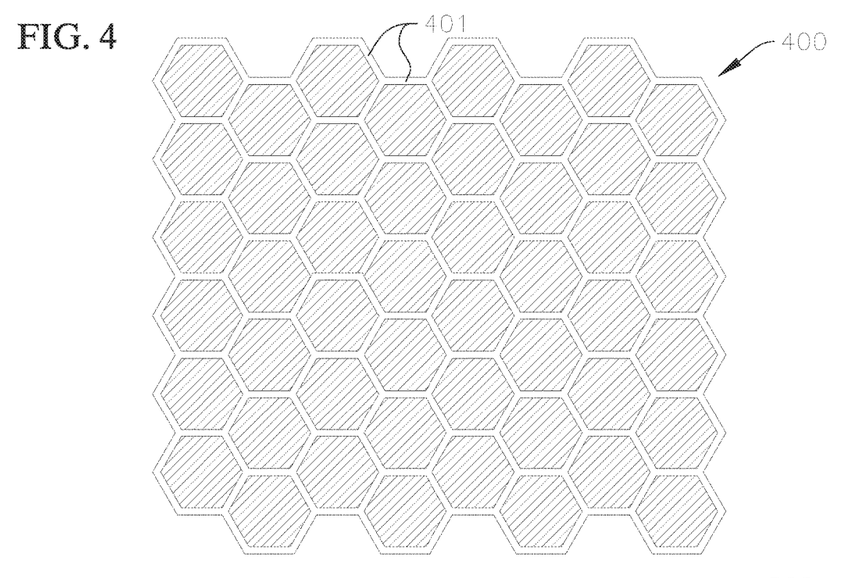
FIG. 4 is a top view of a photomask used during a method of manufacturing a cellular structure according to one embodiment of the present disclosure.
Figure 5:
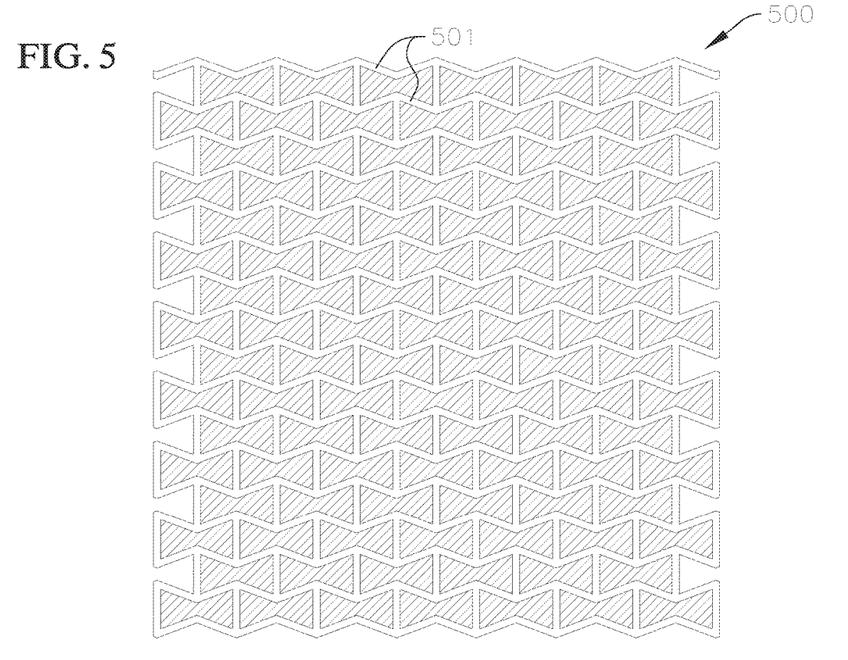
FIG. 5 is a top view of a photomask used during a method of manufacturing a cellular structure according to another embodiment of the present disclosure.

The apertures 305 in the photomask 304 may have any suitable configuration depending on the desired configuration of the unit cells 312 of the ordered cellular structure 311. For instance, FIG. 4 illustrates an embodiment of a photomask 400 defining a series of interconnected hexagonal apertures 401 arranged in a tessellation. Accordingly, in the illustrated embodiment, the hexagonal apertures 401 are arranged in a honeycomb pattern. In one or more alternate embodiments, the hexagonal apertures 401 defined in the photomask 400 may be arranged in any other suitable arrangement. FIG. 5 illustrates an alternate embodiment of a photomask 500 defining a series of interconnected re-entrant honeycomb-shaped apertures 501 (e.g., bowtie-shaped apertures). In the illustrated embodiment, the re-entrant honeycomb-shaped apertures 501 are arranged in a tessellation. In the illustrated embodiment, the re-entrant honeycomb-shaped apertures 501 are arranged in a series of rows. Additionally, in the illustrated embodiment, the re-entrant honeycomb-shaped apertures 501 are staggered or offset from the re-entrant honeycomb-shaped apertures 501 in adjacent rows. In one or more alternate embodiments, the re-entrant honeycomb-shaped apertures 501 defined in the photomask 500 may be arranged in any other suitable arrangement. In one or more alternate embodiments, the apertures defined in the photomask may have any other suitable shape, such as, for instance, a series of prismatic shapes (e.g., pentagons, squares, or triangles), a series of non-prismatic shapes (e.g., circles), or combinations thereof, depending on the desired configuration of the unit cells of the cellular structure. In one or more embodiments, the apertures defined in the photomask may each include one or more elongated segments or portions surrounding an opaque area of the photomask, and the one or more elongated segments of the apertures may be straight or curved.

Additionally, although in the embodiments illustrated in FIGS. 4 and 5 the apertures 401, 501 are uniform across the photomask 400, 500, respectively, in one or more alternate embodiments, the method may include selecting a photomask having non-uniform apertures. A photomask having non-uniform apertures may be selected to create spatial variations in the configuration of the ordered cellular structure (e.g., spatial variations in the wall thickness t of the unit cells 312 across the ordered cellular structure 311, variations in the unit cell 312 shape across the ordered cellular structure 311, and/or variations in unit cell 312 size across the ordered cellular structure 311). For instance, although in the illustrated embodiments the method includes selecting a photomask 304, 400, or 500 having apertures 305, 401, 501 with a constant slit width w across the photomask 304, 400, or 500, in one or more embodiments, the method may include selecting a photomask having apertures with varying slit widths w across the photomask. Accordingly, when the one or more light beams 308 are directed through the apertures 305 and into the volume of the photo-monomer 307 to form the cellular structure 311, the wall thicknesses t of the straight wall segments 313 of the unit cells 312 will vary across the cellular structure 311. Additionally, in one or more embodiments, the method may include selecting a photomask having apertures that vary in shape and/or the size across the photomask. Accordingly, when the one or more light beams 308 are directed through the apertures 305 and into the volume of the photo-monomer 307 to form the ordered cellular structure 311, the shape and/or size of the unit cells 312 will vary across the ordered cellular structure 311. In this manner, the method may include spatially tailoring the mechanical properties (e.g., strength and stiffness) of the ordered cellular structure 311 depending on the intended application of the ordered cellular structure 311.

The method also includes a task of removing the partially cured ordered cellular structure 311 from the reservoir 303 and any unpolymerized liquid photo-monomer remaining in the reservoir 303. The method also includes a task of cleaning excess, uncured resin from the surface of the partially cured ordered cellular structure 311 once the ordered cellular structure 311 has been removed from the unpolymerized liquid photo-monomer in the reservoir 303. The task of cleaning the excess, uncured resin from the partially cured ordered cellular structure 311 may be performed by any suitable technique, such as, for instance, blowing hot air (e.g., air having a temperature from approximately (about) 20° C. to approximately (about) 120° C. and a pressure from approximately (about) 5 psi to approximately (about) 100 psi) onto the ordered cellular structure 311 to remove the excess resin or dipping the cellular structure 311 in a solvent (e.g., methyl ethyl ketone (MEK), isopropyl alcohol (IPA), or toluene) to dissolve and rinse away the excess, uncured resin. The solvent may be any type or kind of solvent that is suitable for dissolving the type of liquid photo-monomer 307 (e.g., resin) used to form the ordered cellular structure 311.

With reference now to FIG. 3C, in one or more embodiments, the method also includes a task of shaping the partially cured ordered cellular structure 311 into a non-planar shape after removing the partially cured ordered cellular structure 311 from the reservoir 303. The task of shaping the ordered cellular structure 311 may be performed by any suitable manufacturing process, such as, for instance, applying the ordered cellular structure 311 to a mold (e.g., a mandrel) having the desired shape or constraining the ordered cellular structure 311 in the desired shape with tools (e.g., clamps) and/or manually by hand. Suitable techniques for shaping the partially cured ordered cellular structure 311 into a non-planar shape include bending, molding, stretching, impressing, embossing, machining, or combinations thereof. The ordered cellular structure 311 may be shaped into any suitable shape depending on the intended application of the ordered cellular structure. In one or more embodiments, the task of shaping the ordered cellular structure 311 into a non-planar shape may be performed during the task of irradiating the photo-monomer 307 in the reservoir 303 by using a mold 300 and a reservoir 303 having a contoured shape such that the photo-monomer 307 will polymerize into the contoured shape of the mold 300. Suitable methods for forming non-planar structures are described in U.S. Patent Application No. 62/036,911, entitled Method for Fabricating Dual Curvature Micro-Truss Structures, the entire content of which is incorporated herein by reference. In one or more embodiments, the method may not include the task of shaping the ordered cellular structure 311 into a non-planar shape (e.g., the method may include forming a planar or substantially planar ordered cellular structure 311).

The method may also include a task of fully curing (i.e., post-curing) the partially cured ordered cellular structure 311 after the partially cured ordered cellular structure 311 has been removed from the reservoir 303 and, if applicable, after the task of shaping the partially cured ordered cellular structure 311 into a non-planar shape. In one embodiment, the task of fully curing the ordered cellular structure 311 includes photo-curing by irradiating the ordered cellular structure 311 with light (e.g., UV light having an intensity of at least approximately (about) 100 mW/cm) and/or thermally curing the partially cured cellular structure 311 (e.g., exposing the partially cured cellular structure 311 to a vacuum or an inert atmosphere, such as a nitrogen atmosphere, having a temperature from approximately (about) 100° C. to approximately (about) 200° C.) to fully cross-link the polymer optical waveguides. In one or more embodiments, the partially cured cellular structure 311 may be thermally cured by exposing the partially cured ordered cellular structure 311 to a temperature above approximately (about) 120° C., such as, for instance, approximately (about) 160° C. or more.

In one or more embodiments, the method may also include a task of metallizing at least a portion of the fully cured ordered cellular structure 311 to form a metal coating (e.g., a metal shell) on at least a portion of the ordered cellular structure 311. The task of metallizing at least a portion of the ordered cellular structure 311 may be performed to increase the toughness, strength, chemical resistance (e.g., environmental resistance), and/or thermal resistance of the ordered cellular structure 311. The task of metallizing at least a portion of the ordered cellular structure 311 may also be performed to improve the compatibility of the surface of the ordered cellular structure 311 for processing (e.g., wetting for casting). In one or more embodiments, the task of metallizing at least a portion of the ordered cellular structure 311 forms a metal coating (e.g., a metal shell) having a thickness of at least 100 nanometers (nm). The task of metallizing at least a portion of the ordered cellular structure 311 may be performed by any suitable manufacturing process or technique, such as, for instance, sputtering, chemical vapor deposition (CVD), plasma spraying, chemical vapor infiltration (CVI), physical vapor deposition (PVD), evaporation, electroless plating, electroplating, casting, and/or dip coating. In one or more embodiments, the task of metallizing at least a portion of the ordered cellular structure 311 may include one or more liquid vapor deposition techniques and/or one or more vapor deposition techniques. Additionally, in one or more embodiments, the task of metallizing at least a portion of the ordered cellular structure 311 includes depositing a first layer of metal on at least a portion of the ordered cellular structure 311 (e.g., by electroless plating, sputtering, evaporation, chemical vapor deposition (CVD), chemical vapor infiltration (CVI), and/or physical vapor deposition (PVD)) and depositing a second layer or metal on at least a portion of the ordered cellular structure 311 (e.g., by electroplating). Suitable techniques for metallizing structures are disclosed in U.S. application Ser. No. 14/462,306, entitled Structures Having Selectively Metallized Regions and Methods of Manufacturing the Same, the entire content of which is incorporated herein by reference.

Figure 6A:
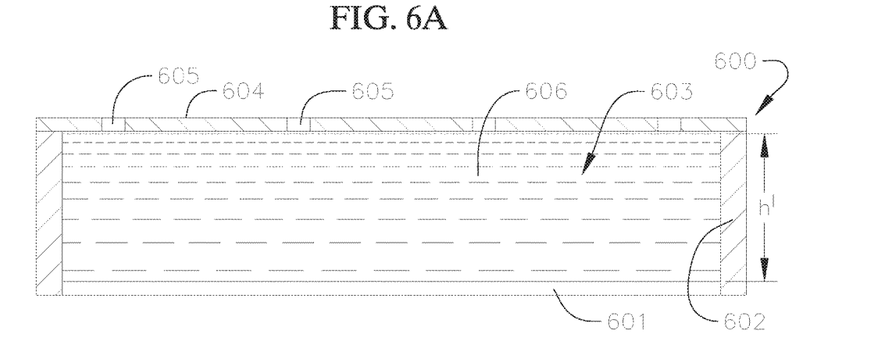
FIGS. 6A-6C are schematic illustrations of tasks of manufacturing a ceramic cellular structure according to one embodiment of the present disclosure.
Figure 6B:
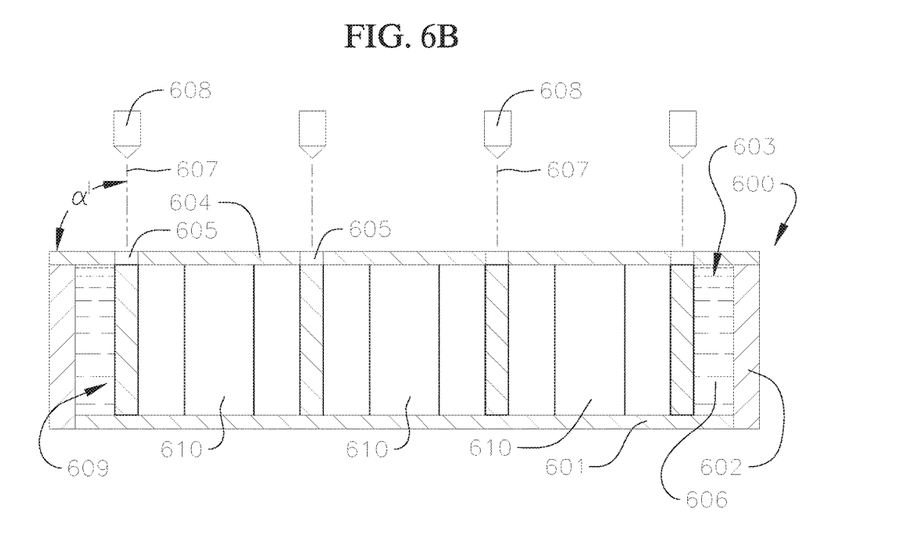
Figure 6C:
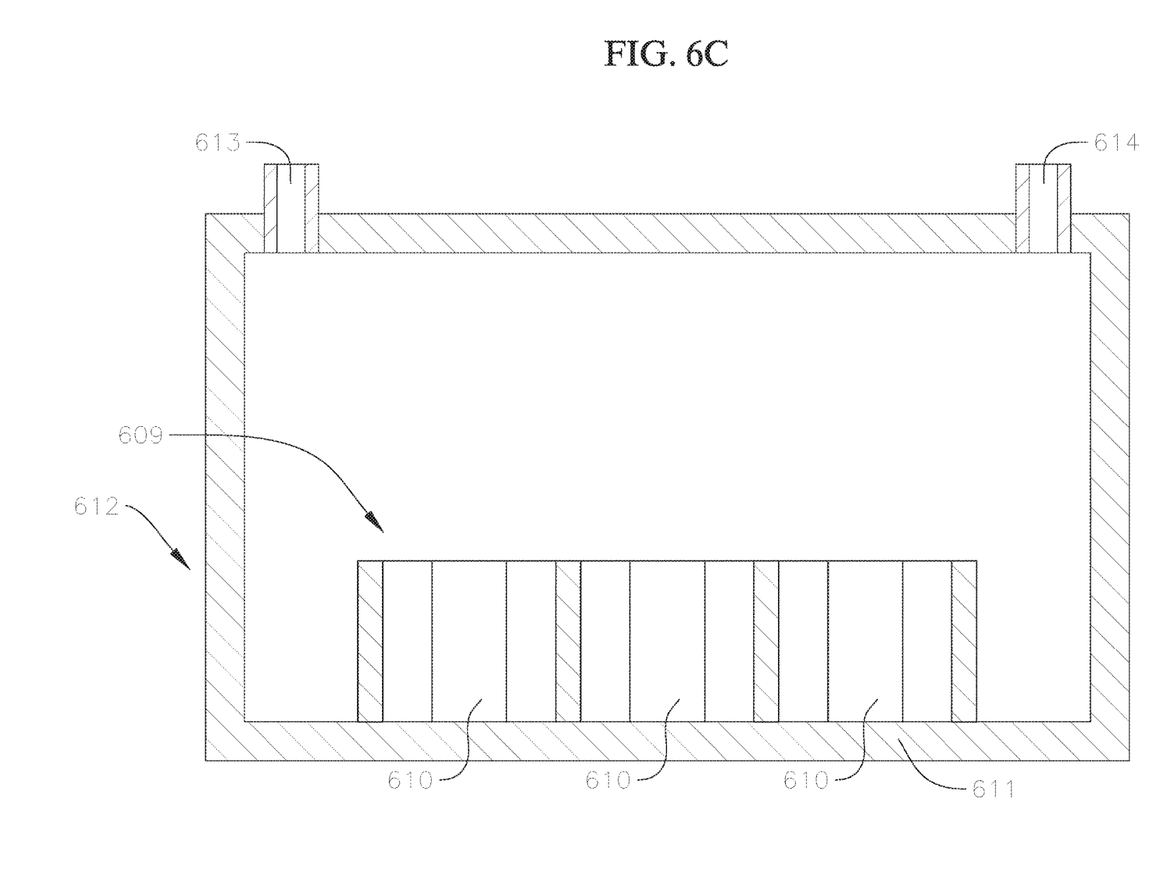

With reference now to FIGS. 6A-6C, a method of manufacturing an ordered ceramic cellular structure according to one embodiment of the present disclosure will now be described. In the embodiment illustrated in FIG. 6A, the method includes a task of obtaining or providing a mold 600 having a base 601 and vertical wall or rim 602 extending upward from a periphery of the base 601. Together, the base 601 and the rim 602 of the mold 600 define a chamber or reservoir 603. With continued reference to the embodiment illustrated in FIG. 6A, the method also includes a task of covering an upper end of the reservoir 603 with a photomask 604 defining a series of apertures 605. The photomask 604 may define any desired number of apertures 605 and the apertures 605 may have any desired size, shape, and spacing, depending upon the desired architecture of the cellular structure, as described below in more detail. Additionally, the photomask 604 may be made of any suitable material, such as, for instance, biaxially-oriented polyethylene terephthalate.

With continued reference to the embodiment illustrated in FIG. 6A, the method includes a task of filling the reservoir 603 with the volume of liquid photo-monomer 606. The volume of liquid photo-monomer 606 may be filled to any suitable height h' within the reservoir 603 depending on the desired thickness of the ceramic cellular structure. In one or more embodiments, the liquid photo-monomer 606 may be filled to a height h' of greater than or equal to approximately 1.5 mm. The photo-monomer 606 is configured to polymerize when exposed to light within a particular range of wavelengths, such as, for instance, ultraviolet light (i.e., wavelengths between 250 nm and 400 nm). The liquid photo-monomer 606 may be any suitable type of preceramic precursor monomer configured to polymerize when exposed to light. Suitable liquid preceramic precursor monomers are described in U.S. Pat. Nos. 8,017,193 and 8,906,593 and U.S. Patent Application Nos. 62/128,410 and Ser. No. 12/506,859, the entire contents of each of which are incorporated herein by reference.

Referring now to the embodiment illustrated in FIG. 6B, the method also includes a task of irradiating the volume of liquid photo-monomer 606 in the reservoir 603 with one or more light beams 607 (e.g., one or more collimated or substantially collimated ultraviolet light ("UV") beams) from one or more light sources 608. The task of irradiating the photo-monomer 606 includes directing the one or more light beams 607 from the one or more light sources 608 down through the apertures 605 in the photomask 604. In the illustrated embodiment, the apertures 605 in the photomask 604 are translucent to those wavelengths of light that are configured to polymerize the liquid photo-monomer 606 in the reservoir 603 such that the one or more light beams 607 pass through the apertures 605 in the photomask 604 and irradiate the volume of photo-monomer 606 in the reservoir 603. In one embodiment, the task of irradiating the photo-monomer 606 may also include directing the one or more light beams 607 from the one or more light sources 608 off of one or more mirrors and down through the apertures 605 in the photomask 604. Regions of the liquid photo-monomer 606 that are exposed to the one or more light beams 607 cure (i.e., polymerize). The polymerized regions propagate down through the volume of photo-monomer 606 and form a plurality of polymer optical waveguides. In one embodiment, the polymer optical waveguides are polymerized together into the unitary ordered cellular structure 609 including the series of interconnected unit cells 610. In one or more embodiments, the series of interconnected unit cells 610 of the ordered cellular structure 609 may be made out of any suitable pre-ceramic polymer, such as, for instance, one or more poly-siloxanes, silazanes, silanes, carbosilanes, or combinations thereof. Suitable methods for forming polymer optical waveguides are described in U.S. Pat. Nos. 7,653,279 and 7,382,959, the entire content of both of which are incorporated herein by reference. In one or more alternate embodiments, the method may include covering the base 601 of the reservoir 603 with the photomask 604 and directing the one or more light beams 607 up through apertures 605 in the photomask 604 and up through the base 601 into the volume of liquid photo-monomer 606. In an embodiment in which the method includes covering the base 601 of the reservoir 603 with the photomask 604 and directing the one or more light beams 607 up through apertures 605 in the photomask 604 and up through the base 601, the base 601 of the mold 600 is translucent to those wavelengths of light that are configured to polymerize the liquid photo-monomer 606 in the reservoir 603.

The orientation of the straight wall segments of the ordered cellular structure 609 depends on an incident angle α' of the one or more light beams relative to the photomask 604 (i.e., the orientation of the straight wall segments is a function of the incident angle α' at which the one or more light beams 607 strike the volume of photo-monomer 606 in the reservoir 603). In the illustrated embodiment, the task of irradiating the volume of liquid photo-monomer 606 in the reservoir 603 includes directing the one or more light beams 607 into the liquid photo-monomer 606 at an incident angle α' of approximately (about) 90 degrees relative to the photomask 604 (i.e., the one or more light beams 607 are directed into the photo-monomer 606 in a direction perpendicular or substantially perpendicular to the photomask 604). The incident angle α' of the one or more light sources may be achieved by orienting the one or more light sources 608 and/or the one or more mirrors. In the illustrated embodiment, the task of irradiating the photo-monomer 606 in the reservoir 603 with the one or more lights beams 607 includes directing the one or more light beams 607 into the photo-monomer 606 at an incident angle α' of approximately (about) 90 degrees relative to the photomask 604 to form an ordered cellular structure in which the straight wall segments of the unit cells are perpendicular or substantially perpendicular to upper and lower ends of the ordered cellular structure. In one or more alternate embodiments, the task may include directing the one or more light beams 607 into the photo-monomer 606 at any other suitable incident angle α' depending on the desired orientation of the straight wall segments of the unit cells. For instance, in one or more embodiments, the task may include directing the one or more light beams 607 into the photo-monomer 606 at an incident angle α' that is canted relative to the photomask 604 (e.g., an angle α' from approximately (about) 45 degrees to approximately (about) 90 degrees) to form an ordered cellular structure in which the straight wall segments of the unit cells are canted relative to the upper and lower ends of the ordered cellular structure. The one or more light sources 608 may be any suitable type or kind of lamp capable of emitting one or more light beams within a range of wavelengths configured to polymerize the liquid photo-monomer 606, such as, for instance, mercury arc lamps (e.g., 2000W mercury arc lamp) or light-emitting diodes (LEDs).

Additionally, in one or more embodiments, the task of irradiating the volume of liquid photo-monomer 606 in the reservoir 603 may include varying the incident angles α' of the light beams 607 at different locations along the photomask 604 (e.g., by varying the orientation of the one or more light sources 608 and/or the orientation of the mirrors) to form an ordered cellular structure 609 in which the orientation of the straight wall segments varies across the ordered cellular structure.

The apertures 605 in the photomask 604 may have any suitable configuration depending on the desired configuration of the unit cells of the ordered cellular structure 609. For instance, in the embodiment illustrated in FIG. 4, the photomask 604 defines a series of interconnected hexagonal apertures 605 arranged in a tessellation. Accordingly, in the illustrated embodiment, the hexagonal apertures 605 are arranged in a honeycomb pattern. In one or more alternate embodiments, the hexagonal apertures 605 defined in the photomask 604 may be arranged in any other suitable arrangement. In an alternate embodiment of the photomask 604 illustrated in FIG. 5, the photomask 604 defines a series of interconnected re-entrant honeycomb-shaped apertures 605. In the illustrated embodiment, the re-entrant honeycomb-shaped apertures 605 are arranged in a tessellation. In the illustrated embodiment, the re-entrant honeycomb-shaped apertures 605 are arranged in a series of rows. Additionally, in the illustrated embodiment, the re-entrant honeycomb-shaped apertures 605 are staggered or offset from the re-entrant honeycomb-shaped apertures 605 in an adjacent row. In one or more alternate embodiments, the re-entrant honeycomb-shaped apertures 605 defined in the photomask 604 may be arranged in any other suitable arrangement. In one or more alternate embodiments, the apertures 605 defined in the photomask 604 may have any other suitable shape, such as, for instance, a series of prismatic shapes (e.g., pentagons, squares, or triangles) and/or a series of non-prismatic shapes (e.g., circles) depending on the desired configuration of the unit cells of the cellular structure.

Following the task of irradiating the photo-monomer 606 with the one or more light beams 607, the cellular structure 609 is in a partially cured state (i.e., a green state). That is, following the task of irradiating the photo-monomer 606 with the one or more light beams 607, the functional groups of the ordered cellular structure 609 are partially cross-linked. The method also includes a task of removing the partially cured ordered cellular structure 609 from the reservoir 603 and any unpolymerized liquid photo-monomer remaining in the reservoir 603. In one or more embodiments, the method also includes a task of shaping the partially cured ordered cellular structure 609 into a non-planar shape after removing the partially cured ordered cellular structure from the reservoir 603. The task of shaping the ordered cellular structure 609 may be performed by any suitable manufacturing process, such as, for instance, applying the ordered cellular structure 609 to a mold (e.g., a mandrel) having the desired shape or constraining the ordered cellular structure 609 in the desired shape with tools (e.g., clamps) and/or manually by hand.

The method may also include a task of fully curing (i.e., post-curing) the partially cured ordered cellular structure 609 after the partially cured ordered cellular structure 609 has been removed from the reservoir and, if applicable, after the task of shaping the partially cured ordered cellular structure 609 into a non-planar shape. In one embodiment, the task of fully curing the ordered cellular structure 609 includes photo-curing by irradiating the ordered cellular structure 609 with light (e.g., UV light having an intensity of at least approximately 100 mW/cm) and/or thermally curing the partially cured cellular structure 609 (e.g., exposing the partially cured cellular structure to a vacuum or an inert atmosphere, such as a nitrogen atmosphere, having a temperature from approximately (about) 100° C. to approximately (about) 200° C.) to fully cross-link the polymer optical waveguides. In one or more embodiments, the partially cured cellular structure 609 may be thermally cured by exposing the partially cured ordered cellular structure 609 to a temperature above approximately (about) 120° C., such as, for instance, approximately (about) 160° C. or more.

With reference now to the embodiment illustrated in FIG. 6C, the method also includes a task of pyrolyzing the cellular structure 609 after the task of curing the cellular structure 609 to convert the polymer cellular structure 609 to a fully dense ceramic cellular structure (i.e., during the task of pyrolyzing the cellular structure, the polymer is converted to a fully dense ceramic material). Additionally, in one or more embodiments, the task of pyrolyzing the cellular structure 609 produces a ceramic cellular structure having an architected and uniform porosity. In one embodiment, the task of pyrolyzing the cellular structure 609 includes placing the cellular structure 609 on a substrate 611 configured to withstand high temperatures, such as a graphite substrate or an alumina substrate 611, which has been lubricated. The lubricant may be any suitable type of lubricant configured to permit the cellular structure to slide on the substrate 611 (e.g., sliding due to contraction of the cellular structure during the pyrolyzing process), such as, for instance, graphite powder and/or boro-nitride powder. The task of pyrolyzing the cellular structure also includes placing the cellular structure 609 in a furnace 612 having an inlet port 613 for inert gas and an exhaust port 614, and then sealing the cellular structure 609 in the furnace 612. In one or more embodiments, the task of pyrolyzing the cellular structure 609 further includes heating the cellular structure 609 in the furnace 612 to a temperature of at least 600° C., such as, for instance, from approximately (about) 600° C. to approximately (about) 1500° C. In one embodiment, the temperature in the furnace 612 may be increased at a rate less than or equal to approximately (about) 3° C./min (i.e., in one or more embodiments, the heating profile of the furnace 612 may not exceed 3° C./min). In one or more embodiments, the temperature in the furnace 612 may be increased at a rate up to approximately (about) 40° C./min. Additionally, in one or more embodiments, the task of heating the cellular structure 609 includes heating the cellular structure 609 at a maximum temperature for a minimum duration, such as, for instance, from approximately (about) one minute to approximately (about) one hour. In one or more embodiments, the method may include heating the cellular structure 609 at the maximum temperature for longer than one hour. Additionally, during the heating of the cellular structure 609, a non-oxidizing environment is maintained in the furnace 612. For instance, in one or more embodiments, an inert gas, such as argon, nitrogen, or combinations thereof, are fed into the furnace 612 through the inlet port 613 at a sufficient flow rate (e.g., from approximately (about) 100 ml/min to approximately (about) 500 ml/min) to maintain the inert environment in the furnace 612. In one or more embodiments, the method includes feeding the inert gas in the furnace 612 at a pressure of approximately (about) 5 psi or less. In one or more embodiments, the mixture of the one or more gases in the furnace 612 has a total absolute pressure less than approximately (about) 0.05 atmosphere. In one or more embodiments, the mixture of the one or more gases in the furnace 612 includes oxygen having a partial pressure not exceeding approximately (about) 0.01 atmosphere.

During the task of heating the cellular structure 609 in the furnace 612, inerting atmosphere exhaust gases develop in the cellular structure 609 and the cellular structure 609 loses mass and volume, but the cellular structure 609 retains its original shape prior to the task of pyrolyzing the cellular structure 609 (e.g., a planar shape or a non-planar shape if the method includes a task of shaping the cellular structure 609). The percentage of mass and volume loss of the cellular structure 609 depend on the chemical formulations of the photo-monomer 606. Limiting the rate at which the temperature in the furnace 612 is increased (e.g., an increase of less than or equal to approximately (about) 3° C./min) limits the rate at which the inerting atmosphere exhaust gases are developed in the cellular structure 609 and thereby prevents rapid gas expansion in the cellular structure 609, which might otherwise crack, damage, and/or destroy the cellular structure 609. Additionally, in one or more embodiments, at least one dimension of the cellular structure 609 is less than or equal to approximately (about) 4 mm. For instance, in one or more embodiments, the wall thickness t (see FIG. 1A) of the unit cells of the cellular structure 609 is less than approximately (about) 4 mm. Limiting at least one dimension of the cellular structure 609 (e.g., limiting the wall thickness of the cellular structure to approximately (about) 4 mm) enables the exhaust gases, which are generated in the cellular structure 609 during the task of pyrolyzing the cellular structure 609, to diffuse out of the cellular structure 609. Exhaust gases may not be able to diffuse out of larger features of the cellular structure 609 without damaging the cellular structure 609. Additionally, the cellular configuration or architecture of the cellular structure 609 aids the exhaust gases in escaping from the cellular structure 609 without damaging the cellular structure 609. The exhaust gases generated in the cellular structure 609 are purged and vented out of the furnace 612 through the exhaust port 614.

Following the task of heating the cellular structure 609 in the furnace 612, the task of pyrolyzing the cellular structure 609 includes a task of cooling the cellular structure 609 to room temperature at a sufficiently slow rate to prevent cracking of the cellular structure 609 due to thermal stresses. For instance, in one or more embodiments, the task of cooling the cellular structure 609 to room temperature may include cooling the cellular structure 609 to room temperature at a rate of approximately (about) 3° C./min or less, such as, for instance, approximately (about 1°) C/min. The cellular structure 609 may be removed from the furnace 612 following the task of cooling the cellular structure 609 to room temperature.

In one or more embodiments, the ceramic cellular structure includes, as a major component, silicon, carbon, oxygen, or a combination thereof. In one or more embodiments, the ceramic cellular structure includes, as a major component, a combination of at least two elements selected from the group of silicon, carbon, nitrogen, oxygen, boron, and aluminum. In one or more embodiments, the chemical composition of the ceramic cellular structure includes approximately (about) 27 at % silicon (Si), approximately (about) 36 at % oxygen (O), approximately (about) 33 at % carbon (C), and/or approximately (about) 4 at % sulfur (S). In one or more embodiments, the ceramic cellular structure has from approximately (about) 0.01 at % sulfur to approximately (about) 20 at % sulfur.

In one or more embodiments, the method may also include a task of metallizing at least a portion of the ceramic cellular structure to form a metal coating (e.g., a metal shell) on at least a portion of the ceramic cellular structure. The task of metallizing at least a portion of the ceramic cellular structure may be performed to increase the toughness, strength, chemical resistance (e.g., environmental resistance), and/or thermal resistance of the cellular structure. The task of metallizing at least a portion of the ceramic cellular structure may also be performed to improve the compatibility of the surface of the ceramic cellular structure for processing (e.g., wetting for casting). In one or more embodiments, the task of metallizing at least a portion of the ceramic cellular structure forms a metal coating (e.g., a metal shell) having a thickness of at least 100 nanometers (nm). The task of metallizing at least a portion of the ceramic cellular structure may be performed by any suitable manufacturing process or technique, such as, for instance, sputtering, chemical vapor deposition (CVD), plasma spraying, chemical vapor infiltration (CVI), physical vapor deposition (PVD), evaporation, electroless plating, electroplating, casting, and/or dip coating. In one or more embodiments, the task of metallizing at least a portion of the cellular structure may include one or more liquid vapor deposition techniques and/or one or more vapor deposition techniques. Additionally, in one or more embodiments, the task of metallizing at least a portion of the ceramic cellular structure includes depositing a first layer of metal on at least a portion of the ceramic cellular structure (e.g., by electroless plating, sputtering, evaporation, chemical vapor deposition (CVD), chemical vapor infiltration (CVI), and/or physical vapor deposition (PVD)) and depositing a second layer or metal on at least a portion of the ceramic cellular structure (e.g., by electroplating). Suitable techniques for metallizing structures are disclosed in U.S. application Ser. No. 14/462,306, entitled Structures Having Selectively Metallized Regions and Methods of Manufacturing the Same.

Expressions such as "at least one of", "one of" or "selected from" when preceding a list of elements, modify the entire list of elements and do not modify the individual elements of the list. Further, the use of "may" when describing embodiments of the present invention refers to "one or more embodiments of the present invention." When a first element is described as being "coupled" or "connected" to a second element, the first element may be directly "coupled" or "connected" to the second element, or one or more other intervening elements may be located between the first element and the second element. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. Although relative terms such as "horizontal," "vertical," "upper," "lower," "inner," "outer" and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" or "coupled to"

another component, it can be directly on or attached to the other component or intervening components may be present therebetween.

What is claimed is:

1. An ordered cellular structure, comprising:
a plurality of interconnected unit cells,
wherein each unit cell of the plurality of interconnected unit cells comprises a plurality of interconnected solid, straight wall segments extending in a same direction from a first end of the unit cell to a second end of the unit cell opposite the first end,
wherein the plurality of interconnected solid, straight wall segments of each unit cell are arranged in a closed loop,
wherein each unit cell of the plurality of interconnected unit cells is open at the first end and the second end, and
wherein each unit cell comprises a pre-ceramic polymer.

2. The ordered cellular structure of claim 1, wherein the plurality of interconnected unit cells is arranged in a tessellation.

3. The ordered cellular structure of claim 1, wherein the pre-ceramic polymer is selected from the group consisting of poly-siloxanes, silazanes, silanes, carbosilanes, and combinations thereof.

4. The ordered cellular structure of claim 2, wherein each unit cell of the plurality of interconnected unit cells is a hexagonal prism.

5. The ordered cellular structure of claim 2, wherein each unit cell of the plurality of interconnected unit cells is a re-entrant prism.

6. The ordered cellular structure of claim 1, wherein the ordered cellular structure has a non-planar curvature.

7. The ordered cellular structure of claim 6, wherein the non-planar curvature is selected from the group of shapes consisting of a conical shape, a tubular shape, and saddle-shaped.

8. The ordered cellular structure of claim 6, wherein the non-planar curvature has a radius of curvature from 3 times a thickness of the ordered cellular structure to 100 times the thickness of the ordered cellular structure.

9. The ordered cellular structure of claim 1, further comprising a metal coating on an outer surface of the ordered cellular structure.

10. The ordered cellular structure of claim 1, further comprising:
a first facesheet at the first end of the ordered cellular structure; and
a second facesheet at the second end of the ordered cellular structure.

11. The ordered cellular structure of claim 1, wherein a wall thickness of each unit cell of the plurality of interconnected unit cells is less than 4 mm, and wherein the wall thickness of each unit cell is configured to enable each unit cell to diffuse exhaust gases generated during pyrolysis of the ordered cellular structure.

12. The ordered cellular structure of claim 1, wherein at least one of a shape and a size of the unit cells varies across the ordered cellular structure.

13. A method of manufacturing an ordered cellular structure according to claim 1 comprising a plurality of interconnected unit cells, each unit cell of the plurality of interconnected unit cells comprising a plurality of interconnected solid, straight wall segments extending in a same direction from a first end of the unit cell to a second end of the unit cell opposite the first end, the method comprising:
irradiating a volume of photo-monomer in a reservoir with at least one light beam from at least one light source, the irradiating the volume of photo-monomer forming a partially cured polymer cellular structure;
post-curing the partially cured polymer cellular structure to form a fully cured polymer cellular structure; and
pyrolyzing the fully cured polymer cellular structure to form the ordered cellular structure having the plurality of interconnected unit cells,
wherein the plurality of interconnected solid, straight wall segments of each unit cell are arranged in a closed loop, and
wherein each unit cell of the plurality of interconnected unit cells is open at the first end and the second end.

14. The method of claim 13, further comprising shaping the partially cured polymer cellular structure into a non-planar shape.

15. The method of claim 13, further comprising metallizing at least a portion of a surface of the ordered cellular structure.

16. The method of claim 13, wherein the pyrolyzing the fully cured polymer cellular structure comprises heating the fully cured polymer cellular structure in a furnace to a temperature of at least 600° C. in an inert atmosphere.

17. The method of claim 16, wherein the heating the fully cured polymer cellular structure comprises raising a temperature in the furnace at a rate less than or equal to about 40° C. per minute.

18. The method of claim 16, wherein inerting atmosphere exhaust gases develop in the fully cured polymer cellular structure during the pyrolyzing of the fully cured polymer cellular structure, and wherein the method further comprises purging the inerting atmosphere exhaust gases from the furnace.

19. The method of claim 13, wherein the at least one straight wall segment of each unit cell has a wall thickness less than or equal to about 4 mm.

* * * * *